United States Patent
Ashley et al.

(10) Patent No.: US 8,223,827 B2
(45) Date of Patent: Jul. 17, 2012

(54) METHOD AND APPARATUS FOR GENERATING FILTER TAP WEIGHTS AND BIASES FOR SIGNAL DEPENDENT BRANCH METRIC COMPUTATION

(75) Inventors: Jonathan James Ashley, Los Gatos, CA (US); Keenan Terrell O'Brien, Longmont, CO (US); Richard Rauschmayer, Longmont, CO (US); Sumeet Sanghvi, Santa Clara, CA (US); Anne Q. Ye, Sunnyvale, CA (US); Kaichi Zhang, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 1301 days.

(21) Appl. No.: 10/839,784

(22) Filed: May 5, 2004

(65) Prior Publication Data

US 2005/0249273 A1    Nov. 10, 2005

(51) Int. Cl.
*H03K 5/159* (2006.01)

(52) U.S. Cl. ........... 375/232; 375/230; 375/229; 333/18

(58) Field of Classification Search .................. 375/232, 375/230, 229; 333/18
See application file for complete search history.

(56) References Cited

U.S. PATENT DOCUMENTS

| | | | | |
|---|---|---|---|---|
| 3,992,616 A * | 11/1976 | Acker | ............................ | 708/323 |
| 4,217,586 A * | 8/1980 | McGuffin | ...................... | 342/380 |
| 4,483,009 A * | 11/1984 | Honda et al. | .................. | 375/232 |
| 4,622,537 A * | 11/1986 | Aiko | ............................... | 341/51 |
| 4,726,035 A * | 2/1988 | Bullock et al. | ................ | 375/232 |
| 5,052,043 A * | 9/1991 | Gaborski | ....................... | 382/157 |
| 5,150,379 A | 9/1992 | Baugh et al. | | |
| 5,202,903 A * | 4/1993 | Okanoue | ........................ | 375/347 |
| 5,228,058 A * | 7/1993 | Ushirokawa et al. | ......... | 375/232 |
| 5,272,723 A * | 12/1993 | Kimoto et al. | ................ | 375/232 |
| 5,313,212 A * | 5/1994 | Ruzicka | ........................ | 342/101 |

(Continued)

FOREIGN PATENT DOCUMENTS

JP    2003045121    2/2003

(Continued)

OTHER PUBLICATIONS

"Decision feedback equalization in channels with signal-dependent media noise" Kavcic, A.; Magnetics, IEEE Transactions on vol. 37, Issue 4, Part 1, Jul. 2001 pp. 1909-1911 Digital Object Identifier 10.1109/20.951005.*

*Primary Examiner* — Shuwang Liu
*Assistant Examiner* — Michael Neff
(74) *Attorney, Agent, or Firm* — Ryan, Mason & Lewis, LLP (57) ABSTRACT

A method and apparatus are provided for determining a plurality of filter tap weights or biases (or both) for a noise predictive filter used to generate one or more signal dependent branch metrics. A filter tap weight or filter bias (or both) are adaptively accumulated for each possible data condition. The data conditions may comprise, for example, each possible data pattern for a given data dependency length. The appropriate accumulated filter tap weight or bias to update can be selected based on a data condition associated with the current received data. The filter tap weights associated with a delay 0 tap can be adapted for each filter condition except for a single normalizing condition, whose corresponding delay 0 tap remains fixed.

23 Claims, 8 Drawing Sheets

U.S. PATENT DOCUMENTS

| | | |
|---|---|---|
| 6,169,638 B1 | 1/2001 | Morling |
| 6,741,185 B2 * | 5/2004 | Shi et al. ............... 340/853.2 |
| 7,181,146 B1 * | 2/2007 | Yorks .................... 398/195 |
| 2003/0223517 A1 * | 12/2003 | Fimoff et al. ............ 375/346 |
| 2004/0032683 A1 * | 2/2004 | Ashley et al. ............ 360/46 |
| 2004/0131108 A1 * | 7/2004 | Kyosti .................... 375/148 |
| 2004/0158791 A1 | 8/2004 | Sawaguchi |

FOREIGN PATENT DOCUMENTS

| | | |
|---|---|---|
| JP | 2003085764 | 3/2003 |

* cited by examiner

| 8 | 4 | 2 | 1 |
|---|---|---|---|
| 0000 | | | |
| 1111 | 000 | | |
| 1000 | 111 | | |
| 0111 | | 00 | |
| 0100 | | 11 | |
| 1011 | 100 | | |
| 1100 | 011 | | |
| 0011 | | | |
| 0010 | | | φ |
| 1101 | 010 | | |
| 1010 | 101 | | |
| 0101 | | 10 | |
| 0110 | | 01 | |
| 1001 | 110 | | |
| 1110 | 001 | | |
| 0001 | | | |

METHOD AND APPARATUS FOR GENERATING FILTER TAP WEIGHTS AND BIASES FOR SIGNAL DEPENDENT BRANCH METRIC COMPUTATION

FIELD OF THE INVENTION

The present invention relates generally to channel equalization and decoding techniques and, more particularly, to sequence estimation techniques with noise compensation.

BACKGROUND OF THE INVENTION

A magnetic recording read channel converts an analog read channel into an estimate of the user data recorded on a magnetic medium. Read heads and magnetic media introduce noise and other distortions into the read signal that correlate with the written user data. A number of techniques have been proposed or suggested for taking statistical correlations between the written user data and distortions into account in order to improve read channel performance.

Previous techniques that used data dependent statistics to improve detector error rates were unwieldy because they required off-board processing to calculate detector parameters from statistics that were off-loaded from the device. This off-load, calculate, and on-load cycle becomes prohibitively time consuming and complex when the number of distinct data conditions used, and the number of correlation lags used, are large enough to realize significant gains in error rate performance.

A need therefore exists for a method and apparatus for adapting to these data correlations without relying on external calculations or circuits. A further need exists for a method and apparatus that can adapt to these data correlations during normal read operations and provide parameter values to the sequence detector (or to a post-processor acting on AN initial NRZ estimate produced by a sequence detector).

SUMMARY OF THE INVENTION

Generally, a method and apparatus are provided for determining a plurality of filter tap weights or biases (or both) for a noise predictive filter used to generate one or more signal dependent branch metrics. A filter tap weight or filter bias (or both) are adaptively accumulated for each possible data condition to thereby permit the computation of data dependent branch metrics. The data conditions may comprise, for example, each possible data pattern for a given data dependency length. The accumulation may be performed by selecting the appropriate accumulated filter tap weight or bias to update based on a data condition associated with the current received data.

Once determined, the accumulated filter tap weights or biases (or both) can be provided, for example, to a Viterbi detector for computation of the one or more branch metrics, or to a post-processor acting on an initial data estimate produced by a Viterbi detector. According to another aspect of the invention, the filter tap weights associated with a delay 0 tap are adapted for each filter condition except for a single normalizing condition, whose corresponding delay 0 tap remains fixed.

A more complete understanding of the present invention, as well as further features and advantages of the present invention, will be obtained by reference to the following detailed description and drawings.

DETAILED DESCRIPTION

The present invention provides an adaptive circuit 100, discussed below in conjunction with FIG. 1, that generates tap weights and biases for a noise predictive filter. The tap weights and biases are used to compute branch metrics. In one implementation of the self-adaptive circuit 100, the generated tap weights and biases provide signal dependent, noise predictive, bias compensated branch metrics. Initially, the computation of branch metrics is discussed in the section entitled "Maximum Likelihood Branch Metrics," before details of the self-adaptive circuit 100 are discussed.

Maximum Likelihood Branch Metrics

A Viterbi detector and an event-based post-processor compute the log-likelihood of a received sequence, given a corresponding NRZ sequence, as a sum of bit-cycle log-likelihood increments, referred to as branch metrics, along the sequence. The underlying assumption behind computing the log-likelihood of a sequence as a sum of increments is that the statistical events whose log-likelihoods correspond to the increments are statistically independent. Statistical independence is approached by using classical linear predictive filtering. When the noise and data are correlated, statistical independence is even more closely approached by conditioning the noise predictive filtering on the given NRZ sequence.

The underlying assumption behind computing each log-likelihood increment (branch metric) as a square difference is that the difference, as a random variable, has a mean zero Gaussian probability distribution. Thus, bias in the filtered noise sample should be subtracted before the squaring operation.

These considerations lead to a definition of data-dependent filtered, bias compensated noise statistics as follows. First, notation for the NRZ conditions for noise predictive filtering and bias compensation are introduced. A data condition length d is then fixed. A partition of the set of all $2^d$ length d blocks of bits is fixed into disjoint sets $\beta$:

$$\{0,1\}^d = \cup \beta.$$

Each set $\beta$ is a bias condition. Another coarser partition of $\{0,1\}^d$ is fixed into disjoint sets $\alpha$, so that each set $\beta$ is contained in some set $\alpha$. Each set $\alpha$ is a filtering condition.

The most important example of the two partitions of $\{0,1\}^d$ into bias conditions and filter conditions is where each bias condition $\beta$ is a singleton set consisting of one bit sequence, $$\beta = \{b_{-d+1} \ldots b_0\},$$

and each filtering condition comprises two polar opposite bit sequences:

$$\alpha = \{b_{-d+1} \ldots b_0, \bar{b}_{-d+1} \ldots \bar{b}_0\}.$$

These partitions are important in practice because empirical second order conditional noise statistics are close to invariant under polarity reversal, while the first order conditional biases change sign under polarity reversal.

Finally, the number of elements in a set $\alpha$ is denoted as $m(\alpha)$.

A correlation length, $c$, corresponding to the maximum tap delay in the noise predictive filters is also fixed. An equalization target length, $e$, is fixed, where each ideal equalized sample $y_i$ depends on NRZ bits $b_{i-e+1} \ldots b_i$. It is assumed for notational simplicity that the data-dependency length $d \leq c+e$ (which is true in practical cases).

Having fixed the correlation length $c$, the data-dependency length $d$, the equalization target length $e$, the partition of $\{0,1\}^d$ into bias condition sets $\beta$, and the coarser partition of $\{0,1\}^d$ into filter condition sets $\alpha$, a data-dependent filtered, bias compensated noise statistic underlying the branch metric corresponding to an NRZ sequence $$a_{-c-e+1} \ldots a_{-1} a_0$$

can be defined, as follows.

Let $\beta$ be the bias condition with $$a_{-d+1} \ldots a_{-1} a_0 \in \beta,$$

and let $\alpha$ be the filter condition with $\beta \subset \alpha$.

In the following formula for the data-dependently filtered, bias compensated noise $f_i^{[\beta]}$ the bit sequence $b_{i-d+1} \ldots b_i$ is denoted as $b_{i-d+1}^i$, $$f_i^{[\beta]} = \sum_{j=0}^{c} p_j^{[\alpha]}(n_{i-j} - E(n_{i-j} \mid b_{i-d+1}^i \in \beta)),$$

where $p_0^{[\alpha]} = 1$, and the $p_j^{[\alpha]}$ satisfy $$\sum_{j=0}^{c} R_{kj}^{[\alpha]} p_j^{[\alpha]} = 0, \; (0 < k \leq c),$$

and where the conditional covariance matrix $R^{[\alpha]}$ is defined by $$R_{kj}^{[\alpha]} = \sum_{\beta \subset \alpha} \frac{m(\beta)}{m(\alpha)} E(n_{i-k}(n_{i-j} - E(n_{i-j} \mid b_{i-d+1}^i \in \beta)) \mid b_{i-d+1}^i \in \beta)$$

$$= E(n_{i-k}(n_{i-j} - E(n_{i-j} \mid b_{i-d+1}^i \in \beta)) \mid \beta \subset \alpha).$$

The statistic $f_i^{[\beta]}$ is the residual noise after signal dependent noise predictive filtering and bias compensation.

It is noted that $R^{[\alpha]}$ is a symmetric matrix, because it can be expressed in the form $$R_{kj}^{[\alpha]} = E((n_{i-k} - E(n_{i-k} \mid b_{i-d+1}^i \in \beta))(n_{i-j} - E(n_{i-j} \mid b_{i-d+1}^i \in \beta)) \mid \beta \subset \alpha)$$

This follows from $E(n_{i-j} - E(n_{i-j} \mid b_{i-d+1}^i \in \beta) \mid b_{i-d+1}^i \in \beta) = 0$.

If it is assumed that the conditional covariance matrix $R^{[\alpha]}$ is positive definite, then it is invertible, and it follows that the vector $p^{[\alpha]} = [p_0^{[\alpha]}, \ldots, p_c^{[\alpha]}]^T$ of noise predictive filter taps is uniquely determined (because $p_0^{[\alpha]} = 1$ fixes the scale). One can verify that the data-dependently filtered, bias compensated noise samples $f_i^{[\beta]}$ satisfy:

$$E(f_i^{[\beta]} \mid b_{i-d+1}^i \in \beta) = 0$$

For each filter condition $\alpha$, the choices of noise predictive filter taps and compensating biases minimizes the mean variance, as follows:

$$(\sigma^{[\alpha]})^2 = \sum_{\beta \subset \alpha} \frac{m(\beta)}{m(\alpha)} E\big((f_i^{[\beta]})^2 \mid b_{i-d+1}^i \in \beta\big) = E\big((f_i^{[\beta]})^2 \mid \beta \subset \alpha\big),$$

over all filter tap weight sets with $p_0^{[\alpha]} = 1$. In the case where each bias condition $\beta$ consists of a single NRZ sequence, each filter condition $\alpha$ consists of a polar opposite pair of NRZ sequences, and where the second order noise statistics are invariant under polarity reversal $$E((f_i^{[\beta]})^2 \mid b_{i-d+1}^i \in \beta) = E((f_i^{[\bar{\beta}]})^2 \mid b_{i-d+1}^i \in \bar{\beta}),$$

so the variance becomes $$(\sigma^{[\alpha]})^2 = E((f_i^{[\beta]})^2 \mid b_{i-d+1}^i \in \beta) = E((f_i^{[\bar{\beta}]})^2 \mid b_{i-d+1}^i \in \bar{\beta}).$$

The independence condition, $$E(n_{i-j} f_i^{[\beta]} \mid b_{i-d+1}^i \in \alpha) = 0, \; (1 \leq j \leq c),$$

shows, under certain assumptions regarding the noise statistics (including that the noise is multivariate Gaussian) that the statistics $f_i^{[\beta]}$ are approximately independent along the true NRZ trellis path.

These three points, taken together, argue that the log-likelihood increment corresponding to the branch with NRZ sequence, $a_{i-c-e+1} \ldots a_{i-1} a_i$ with $a_{i-d+1} \ldots a_{i-1} a_i \in \beta \subset \alpha$, can be expressed using the following (negative) log probability:

$$\frac{(f_i^{[\beta]})^2}{2(\sigma^{[\alpha]})^2} + \log(\sqrt{2\pi} \sigma^{[\alpha]}).$$

If the log term is neglected, and the above expression is normalized by multiplying by $2(\sigma^{[\alpha_0]})^2$, where $\alpha_0$ is a fixed, normalizing filter condition, the branch metric may be expressed as follows:

$$\left(\frac{\sigma^{[\alpha_0]}}{\sigma^{[\alpha]}} f_i^{[\beta]}\right)^2.$$

In practice, the normalizing condition $\alpha_0$ is chosen to minimize $\sigma^{[\alpha]}$.

This branch metric can be calculated in hardware by first filtering the noise estimate using an FIR with tap weights set to the normalized noise predictive filter coefficients (i.e., tap weights):

$$q_j^{[\alpha]} = \frac{\sigma^{[\alpha_0]}}{\sigma^{[\alpha]}} p_j^{[\alpha]}, \; (0 \leq j \leq c),$$

and then subtracting the normalized bias $$\mu^{[\beta]} = \frac{\sigma^{[\alpha_0]}}{\sigma^{[\alpha]}} \sum_{j=0}^{c} p_j^{[\alpha]} E(n_{i-j} \mid b_{i-d+1}^i \in \beta),$$

from the filter output, and finally performing the squaring operation. In summary, the branch metric m ($b_{i-c-e+1}^i$) corresponding to the NRZ sequence, $b_{i-c-e+1}^i = b_{i-c-e+1} \ldots b_{i-1} b_i$ with $b_{i-d+1} \ldots b_{i-1} b_i \in \beta \subset \alpha$, is given by:

$$m(b_{i-c-e+1}^i) = \left(\frac{\sigma^{[\alpha_0]}}{\sigma^{[\alpha]}} f_i^{[\beta]}\right)^2 = \left(\left(\sum_{j=0}^{c} q_j^{[\alpha]} n_{i-j}\right) - \mu^{[\beta]}\right)^2.$$

The present invention provides a self-adaptive circuit 100 that determines the normalized noise predictive tap weights $q_j^{[\alpha]}$ and normalized biases $\mu^{[\beta]}$ that are used in this calculation of the branch metrics $m(b_{i-c-e+1}^i)$.

Generation of Tap Weights and Biases for Branch Metric Computation

Figure 1:
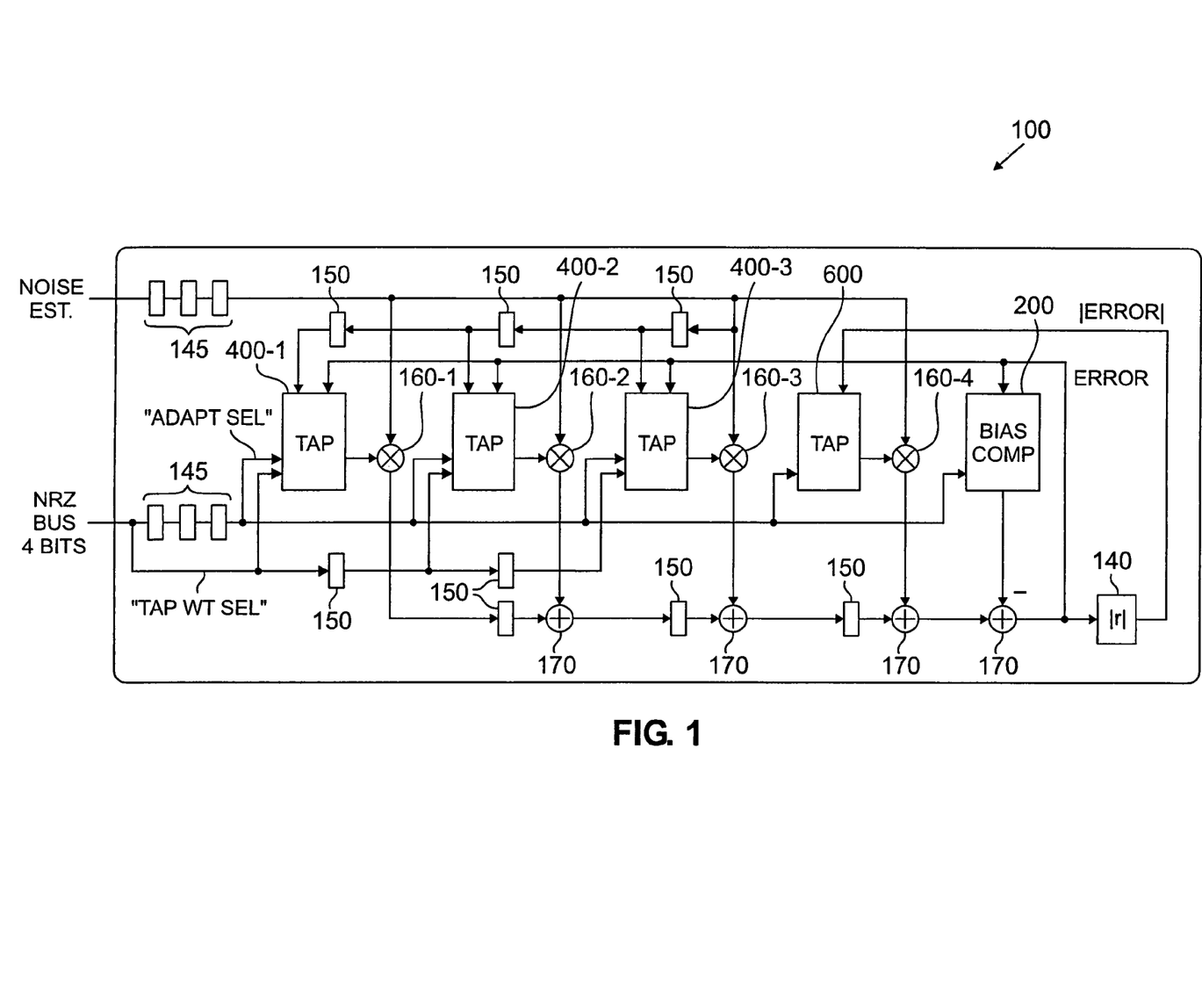
FIG. 1 is a schematic block diagram of an adaptive circuit that determines the predictive filter tap weights and biases that are needed to compute branch metrics in accordance with the present invention.

FIG. 1 is a schematic block diagram of an adaptive circuit 100 that finds the branch metric filters and biases in accordance with the present invention. Generally, the adaptive circuit 100 includes accumulation registers 300, 500 whose values converge to the normalized biases $\mu^{[\beta]}$ and normalized noise predictive tap weights $q_j^{[\alpha]}$ respectively, that are used to calculate the branch metrics $m(b_{i-c-e+1}^i)$ presented above.

As shown in FIG. 1, the exemplary implementation of the adaptive circuit 100 includes three positive delay filter taps 400-1 through 400-3, discussed further below in conjunction with FIG. 4. In other words, the correlation length, c, is equal to three. The adaptive circuit 100 is embodied as a noise predictive FIR as modified herein to provide a number of new features and functions. According to a data dependency feature of the present invention, the filter tap weights for the filter taps 400-1 through 400-3 and compensating biases for a bias compensation block 200, discussed further below in conjunction with FIG. 2, that are used in any one update cycle are controlled (multiplexed) by an estimate of the NRZ data aligned with the noise estimate. According to a bias compensation feature of the present invention, the output of the filter is compensated by a bias cancellation circuit that is inside the filter tap weight adaptation loops. According to a conditional variance normalization feature of the present invention, the delay 0 tap weights $w_0^{[\alpha]}$ adapt for each filter condition $\alpha$ except for a single normalizing condition $\alpha_0$, whose corresponding delay 0 tap remains fixed at $w_0^{[\alpha_0]} = 1$ (instead of being fixed as would be the case with classical linear noise prediction).

The adaptive noise prediction block 100 includes a number of delay elements 150, multipliers 160 and adders 170 that operate in a conventional manner to properly align the various data elements and integrate the values from each cycle.

Once the tap weights and biases generated by the adaptive noise prediction block 100 of FIG. 1 converge (reach equilibrium), they can be provided to a circuit (not shown) that actually computes signal dependent, noise predictive, bias compensated branch metrics. An exemplary circuit for computing such signal dependent, noise predictive, bias compensated branch metrics is described, for example, in A. Kavcic, "Decision Feedback Equalization in Channels with Signal-Dependent Media Noise," IEEE Transactions on Magnetics, Vol 37, 1909-11 (July 2001) or U.S. Pat. No. 6,594,094, each incorporated by reference herein.

Data Dependency and Bias Compensation

As shown in FIG. 1, the adaptive noise prediction block 100 receives a noise estimate, $n_i$, and four consecutive NRZ estimates $b_{i-3} b_{i-2} \ldots b_i$. The noise estimate, $n_i$, and NRZ estimate are aligned as usual, so that $n_i$ is computed as the difference between the equalized sample $y_i$ and the bi-polar NRZ $\tilde{b}_i = b_i - \frac{1}{2}$ convolved with the target, $[t_0 t_1 \ldots t_{e-1}]$, as follows:

$$n_i = y_i - \sum_{j=0}^{e-1} t_j \tilde{b}_{i-j}.$$

The NRZ stream acts as a control signal for the tap update blocks 400-1 through 400-3 and the bias compensation block 200.

Figure 2:
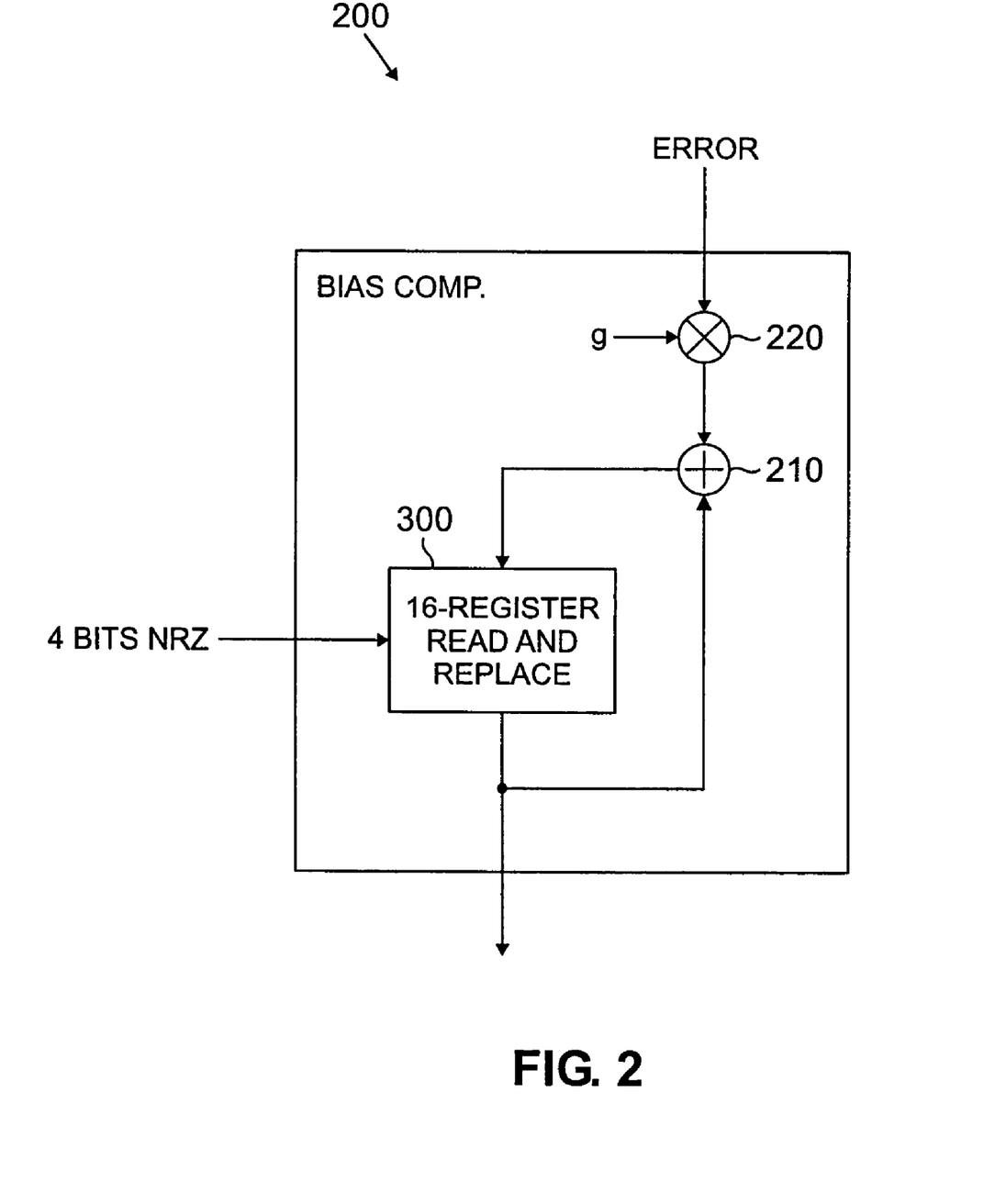
FIG. 2 is a schematic block diagram illustrating the bias compensation block of FIG. 1 in further detail.

As previously indicated, the compensating biases for the bias compensation block 200 that are used in any one update cycle are correlated with the data and are thus controlled (multiplexed) in accordance with the present invention by an estimate of the NRZ data aligned with the noise estimate. FIG. 2 is a schematic block diagram illustrating the bias compensation block 200 of FIG. 1 in further detail. The bias compensation block 200 implements data dependent offset control. The bias compensation block 200 drives each conditional mean of the error signal $e_i$ to zero. So, at equilibrium, $$E(e_i \mid b_{i-d+1} \ldots b_i \in \beta) = 0, (\beta)$$

The bias compensation block 200 can be implemented as a separate accumulator (read and replace function) for each bias condition, $\beta$. In the exemplary implementation where the data dependency, d, is 4 bits, each having two potential values, there are 16 distinct bias conditions, $\beta$, and thus 16 accumulation registers 300, discussed further below in conjunction with FIG. 3. Since only one bias condition $\beta$ holds on any bit cycle, the accumulators can share a single adder 210 to perform the accumulation and multiplier 220 to perform gain control.

Figure 3:
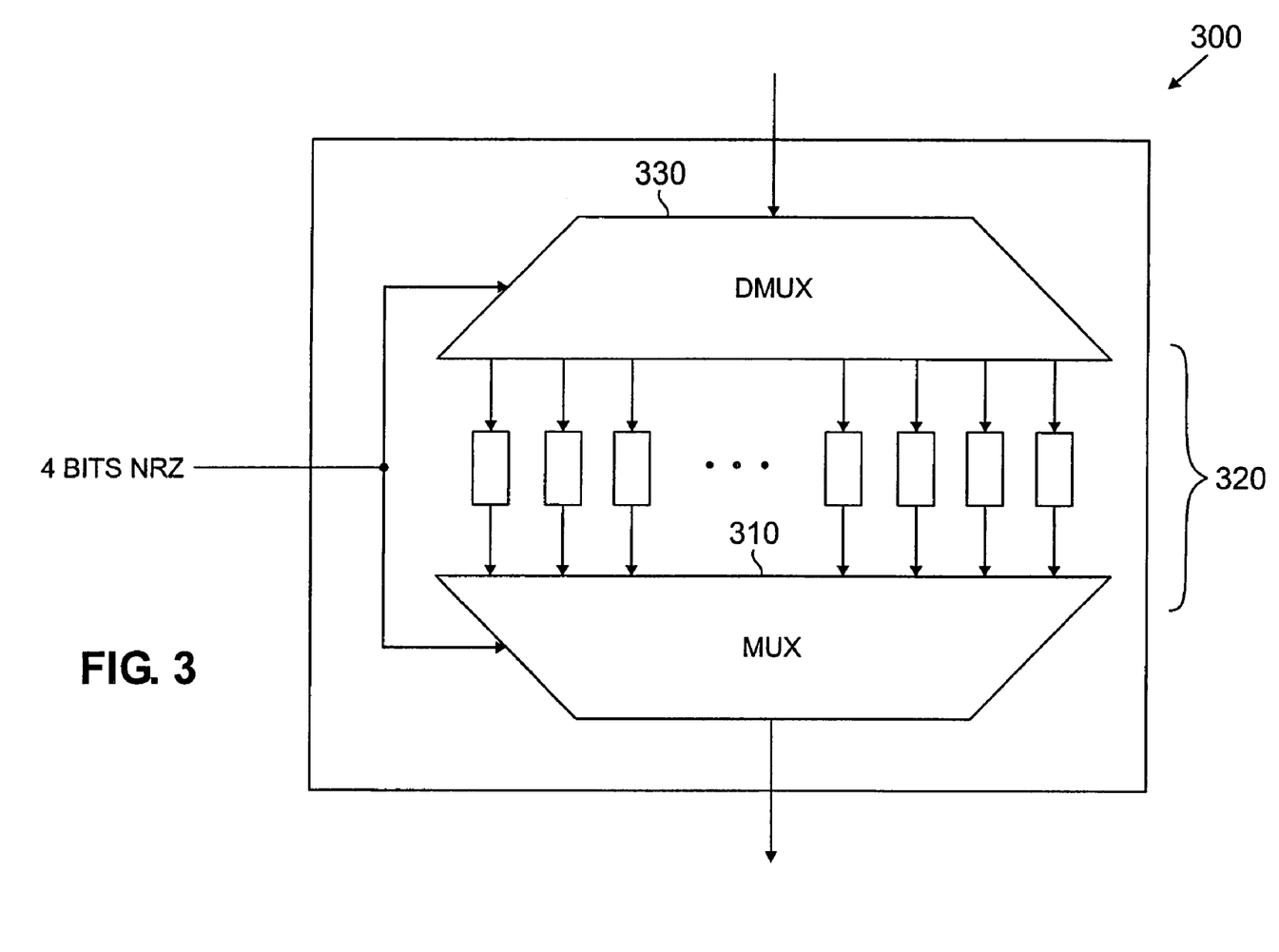
FIG. 3 is a schematic block diagram illustrating an exemplary 16-register read and replace accumulator of FIG. 2 in further detail.

FIG. 3 is a schematic block diagram illustrating the 16-register read and replace accumulator 300 of FIG. 2 in further detail. The choice of the appropriate register to update, namely, the register corresponding to bias condition $\beta$ with $b_{i-d+1} \ldots b_i \beta \beta$, is controlled by the block of NRZ bits $b_{i-d+1} \ldots b_i$ via a multiplexer 310 and demultiplexer 330, for the case d=4. The "read-and-replace" circuit 300 reads $o_i^{[\beta]}$ from an appropriate register 320 (indexed by the block of NRZ bits $b_{i-d+1} \ldots b_i$) and replaces the value in the register with the updated version, $o_{i+1}^{[\beta]} = o_i^{[\beta]} + g e_i$, using adder 210 and multiplier 220.

As previously indicated, the exemplary implementation of the adaptive circuit 100 includes three positive delay filter taps 400-1 through 400-3. FIG. 4 is a schematic block diagram of an exemplary positive delay filter tap 400. Generally, the positive delay filter tap 400 implements a separate accumulator for each filter condition $\alpha$. As indicated above, where each bias condition $\beta$ consists of a single NRZ sequence, each filter condition $\alpha$ consists of a polar opposite pair of NRZ sequences. Due to the symmetric properties, the filter conditions $\alpha$ associated with the 16 distinct bias conditions $\beta$ in the exemplary embodiment can be collapsed two-fold into eight distinct filter conditions $\alpha$ (see also, the discussion below in conjunction with FIG. 7). For example, the bit patterns 0110 and 1001 share the same noise conditions and the corresponding filter conditions, $\alpha$, can be collapsed into a single condition. Since only one filter condition α holds on any bit cycle, the eight accumulators can share a single adder 410 to perform the accumulation and multipliers 420, 430 to calculate the accumulated increment based on the noise estimate, error, and gain factor.

Figure 4:
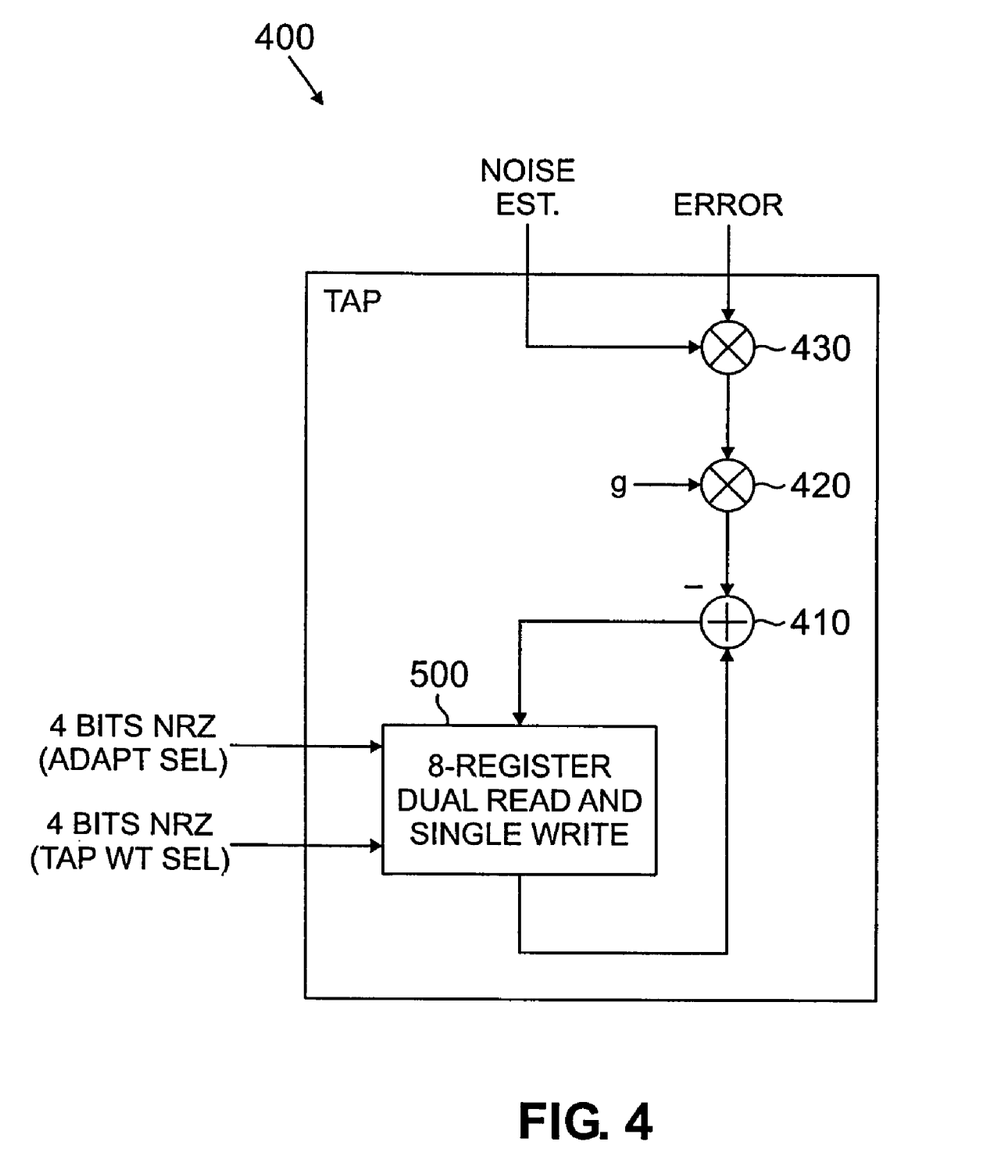
FIG. 4 is a schematic block diagram of an exemplary positive delay filter tap of FIG. 1.
Figure 5:
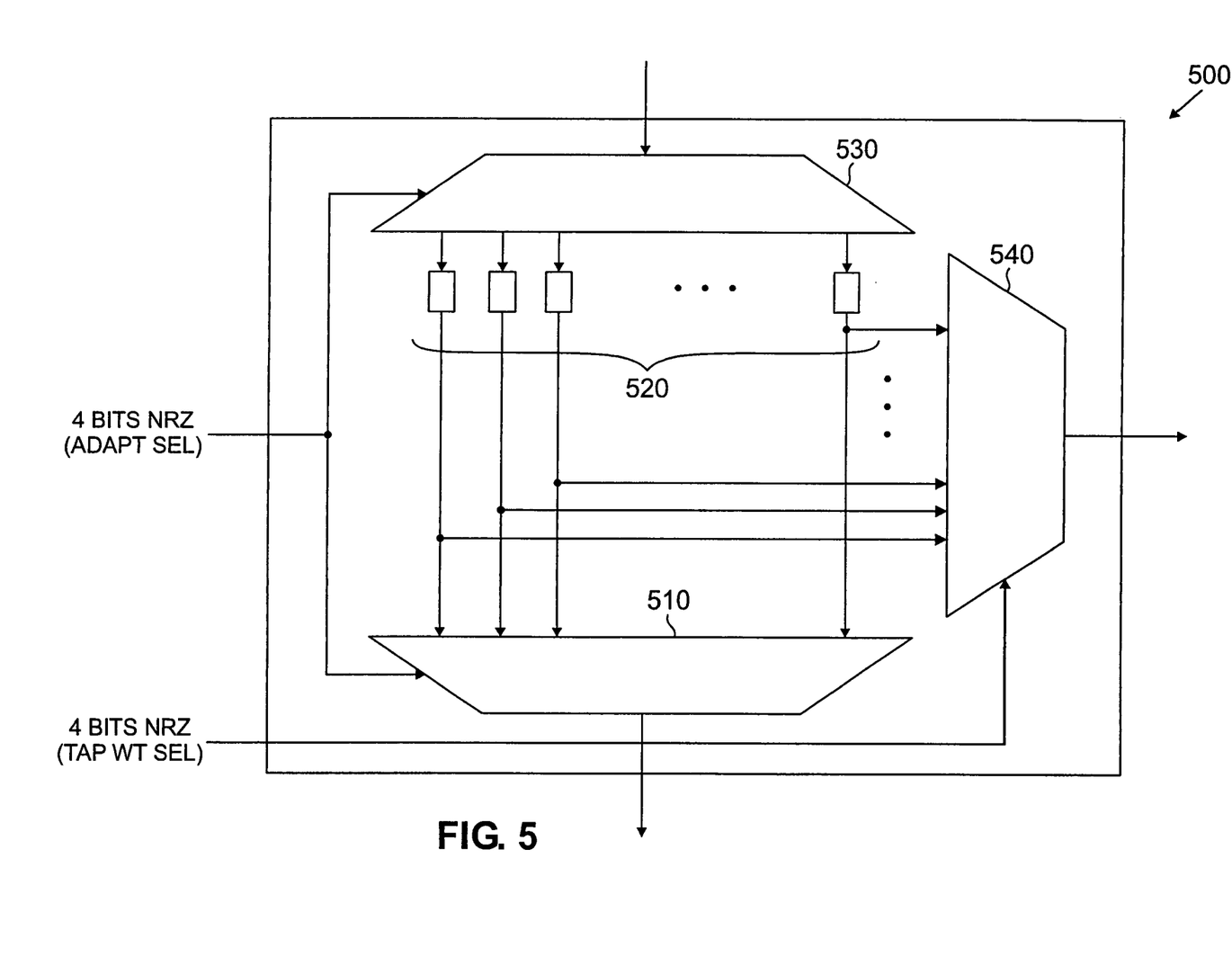
FIG. 5 is a schematic block diagram illustrating an exemplary 8-register dual read single write accumulator of FIG. 4.

FIG. 5 is a schematic block diagram illustrating the 8-register dual read single write accumulator 500 of FIG. 4 in further detail. The choice of which accumulator to update is controlled by the NRZ block $b_{i-d+1} \ldots b_i$ via a multiplexer 510 and demultiplexer 530. The multiplexer 510 and demultiplexer 530 choose the filter condition α for which $b_{i-d+1} \ldots b_i \in \alpha$. The register value $(w_j^{[\alpha]})_i$ for the delay j tap is updated as follows:

$$(w_j^{[\alpha]})_{i+1} = (w_j^{[\alpha]})_i - g n_{i-j} e_i, \ (1 \leq j \leq c),$$

using adder 410 and multipliers 420, 430. It follows that at equilibrium, $$E(n_{i-j} e_i | b_{i-d+1} \ldots b_i \in \alpha) = 0, \ (1 \leq j \leq c).$$

As shown in FIG. 5, the choice of which accumulated value to use as a tap weight in filtering the noise is controlled by a differently delayed version of the block of four NRZ bits, labeled "tap wt sel" in FIG. 5. The relative delay between "tap wt sel" and "adapt sel" is shown in FIG. 1. In particular, the "adapt sel" signal controlling the tap block at delay j, (as well as the noise estimate) (for $1 \leq j \leq c$), is delayed by j bit cycles (using delay elements 145) compared to the "tap wt sel" signal controlling the same tap block. It is noted that the delays on the "tap wt sel" signal are arranged so that all of the summands contributing to a single filter output sample are computed using tap weights $w_j^{[\alpha]}$ corresponding to a single condition α. It is also noted that the delays on the "adapt sel" signal are arranged so that the condition α for which tap weight $w_j^{[\alpha]}$ is updated is the same condition that was used j cycles earlier to select the tap weights in the computation of the filter output sample used in the update.

Figure 6:
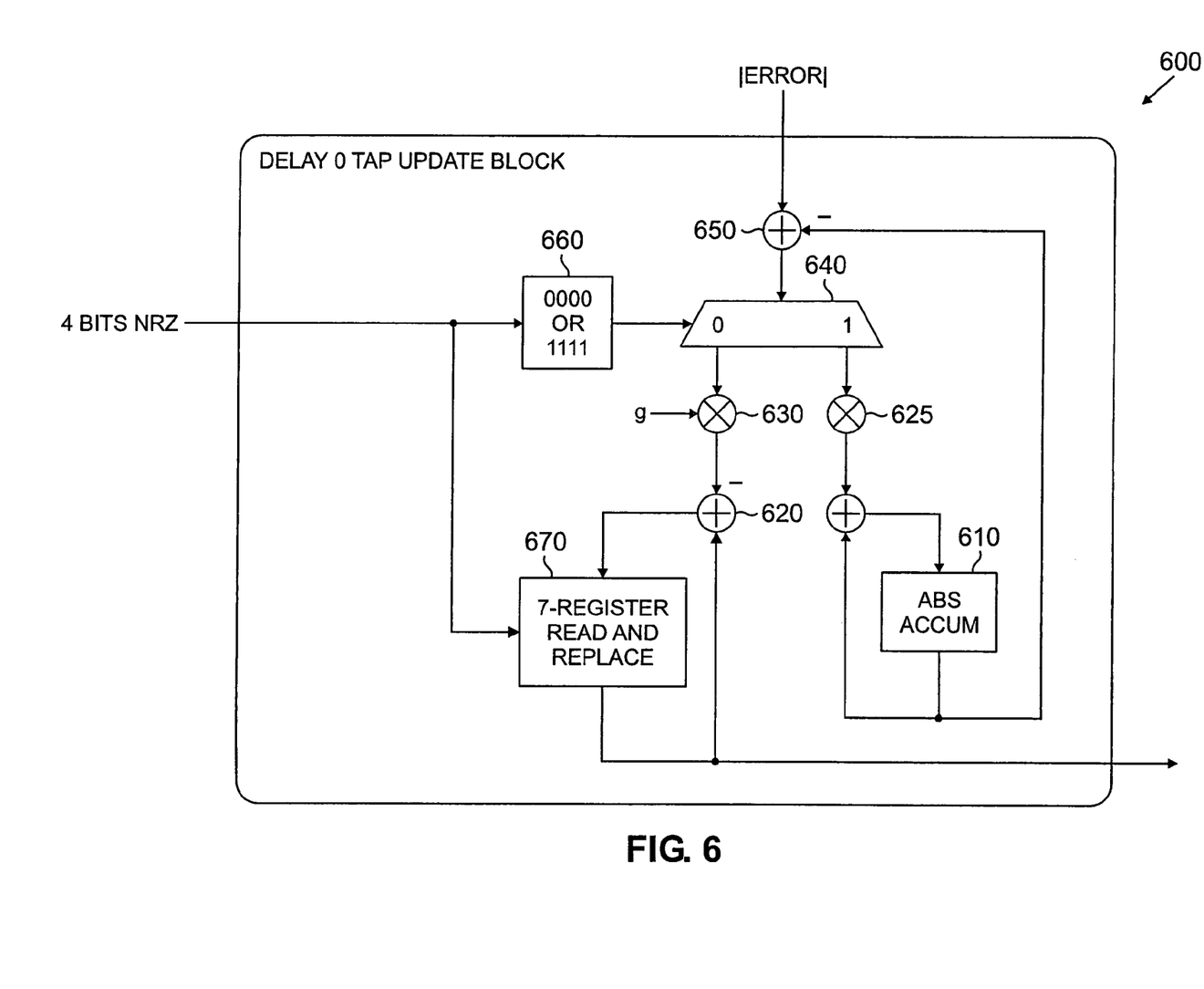
FIG. 6 is a schematic block diagram of an exemplary delay 0 filter tap of FIG. 1.

As previously indicated, the delay 0 tap weights $w_0^{[\alpha]}$ for the delay 0 filter tap 600, shown in FIG. 6, adapt each filter condition α except for a single normalizing condition $\alpha_0$, whose corresponding delay 0 tap remains fixed at $w_0^{[\alpha_0]} = 1$ (instead of being fixed as would be the case with classical linear noise prediction). FIG. 6 is a schematic block diagram of an exemplary delay 0 filter tap 600. As shown in FIG. 6, the adaptive loops implemented by block 600 drive the delay 0 tap weight $w_0^{[\alpha]}$ for each condition a $\alpha \neq \alpha_0$ to the following stable value:

$$w_0^{[\alpha]} = \frac{\sigma^{[\alpha_0]}}{\sigma^{[\alpha]}}.$$

Again, the delay 0 tap weight $w_0^{[\alpha_0]}$ for the normalizing condition $\alpha_0$ is fixed at value one (1). The delay 0 tap weight $w_0^{[\alpha]}$ for each of the other conditions is only constrained (saturated) to be non-negative. This constraint forbids a second, undesirable stable point for α that is the negative of the desired stable point.

The circuit 600 implements the following update equations. Let $\mu_i$ be the register value held in the register 610 labeled "abs accum" in FIG. 6. The update equations for $\mu_i$ implemented using the register 610, adders 615, 650, multiplexer 640 and multiplier 625 are as follows:

$$\mu_{i+1} = \begin{cases} \mu_i + g'(|e_i| - \mu_i) & \text{if } b_{i-d+1}^i \in \alpha_0, \\ \mu_i & \text{otherwise} \end{cases}.$$

Also, $\mu_{i+1}$ is saturated to be non-negative:

$$\mu_{i+1} \geq 0.$$

Thus, $\mu_i$ is a low-passed version of $|e_i|$, restricted to cycles i when $b_{i-d+1}^i \in \alpha_0$. This filtering of $|e_i|$ for the normalizing condition $\alpha_0$ ensures that variations in $\mu_i$ from its mean are only weakly correlated with $|e_i|$. Furthermore, it follows from the update equations for $\mu_i$ that at equilibrium, $$\mu_i = E(|e_i| | b_{i-d+1}^i \in \alpha_0).$$

The read and replace register 670, together with the adder 620, multiplier 630 and multiplexer 640 implements the following update equations for the register values $w_0^{[\alpha]}$ corresponding to the delay 0 taps for conditions $\alpha \neq \alpha_0$:

$$(w_0^{[\alpha]})_{i+1} = \begin{cases} (w_0^{[\alpha]})_i - g(|e_i| - \mu_i) & \text{if } b_{i-d+1}^i \in \alpha, \\ (w_0^{[\alpha]})_i & \text{otherwise} \end{cases}.$$

It is noted that the read and replace register 670 may be implemented in a similar manner to the register 300, described above in conjunction with FIG. 3. It follows from the update equations that at equilibrium, $$E(|e_i| | b_{i-d+1}^i \in \alpha) = \mu_i = E(|e_i| | b_{i-d+1}^i \in \alpha_0), (\alpha).$$

This, together with $$E(|e_i| | b_{i-d+1}^i \ldots b_i \in \beta) = 0, (\beta).$$

and the assumption that the noise is multivariate Gaussian, give equal conditional variances of the filtered, bias compensated noise $e_i$ for the filter conditions α and $\alpha_0$:

$$E(e_i^2 | b_{i-d+1}^i \in \alpha) = E(e_i^2 | b_{i-d+1}^i \in \alpha_0), (\alpha).$$

Adaptive Circuit Variations

In this section, a minor modification to the adaptive circuit 100 is described that allows the dependency length d to be programmable from d=0 up to a maximum value. In practice, the dependency length should be programmed to be the smallest value that saturates the performance gains provided by increasingly refined data-dependency. There are two advantages in doing this. First, adaptation time is approximately cut in half for each decrement of d by one. Second, if d exceeds the true data-dependency window of the noise and distortion, then any differences between the adaptation for two conditions having the same statistics are due to adaptation noise. Such differences will only degrade performance.

Figure 7:
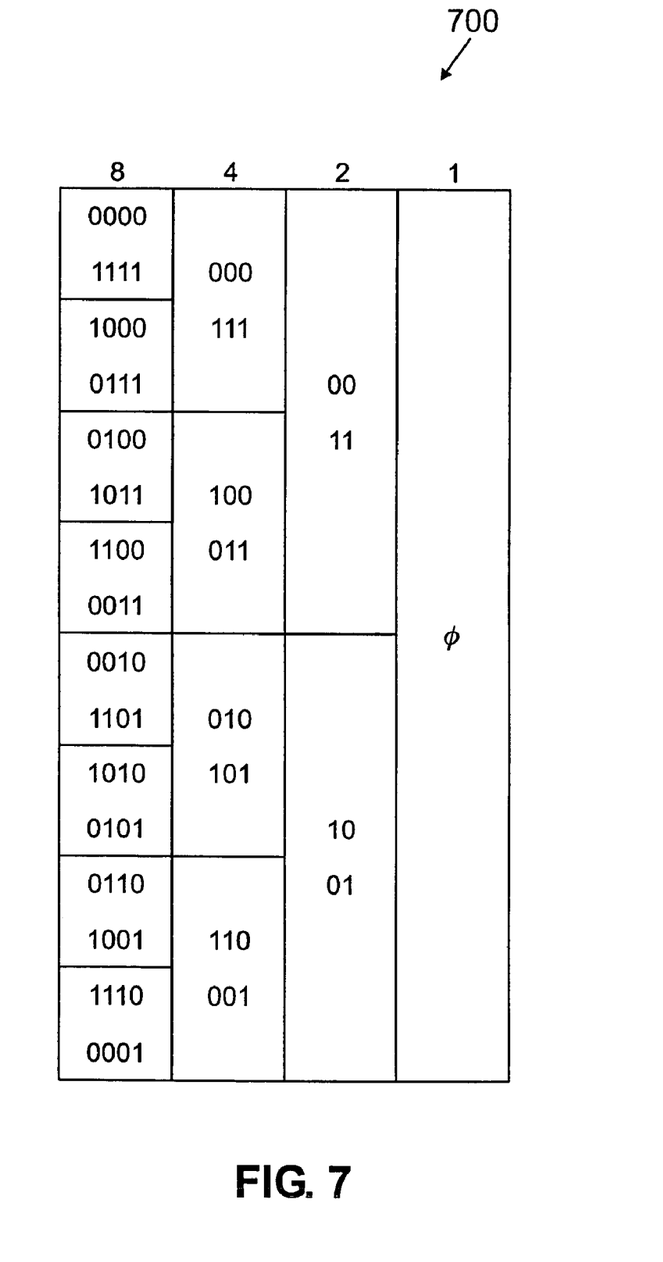
FIG. 7 is a table illustrating how eight exemplary filter conditions $\alpha$ collapse together in pairs with each decrement in the data dependency parameter.

FIG. 7 is a table 700 illustrating how eight exemplary filter conditions α (each comprising a polar opposite pair of length 4 NRZ sequences) collapse together in pairs with each decrement in d by 1 starting at d=4.

Figure 8:
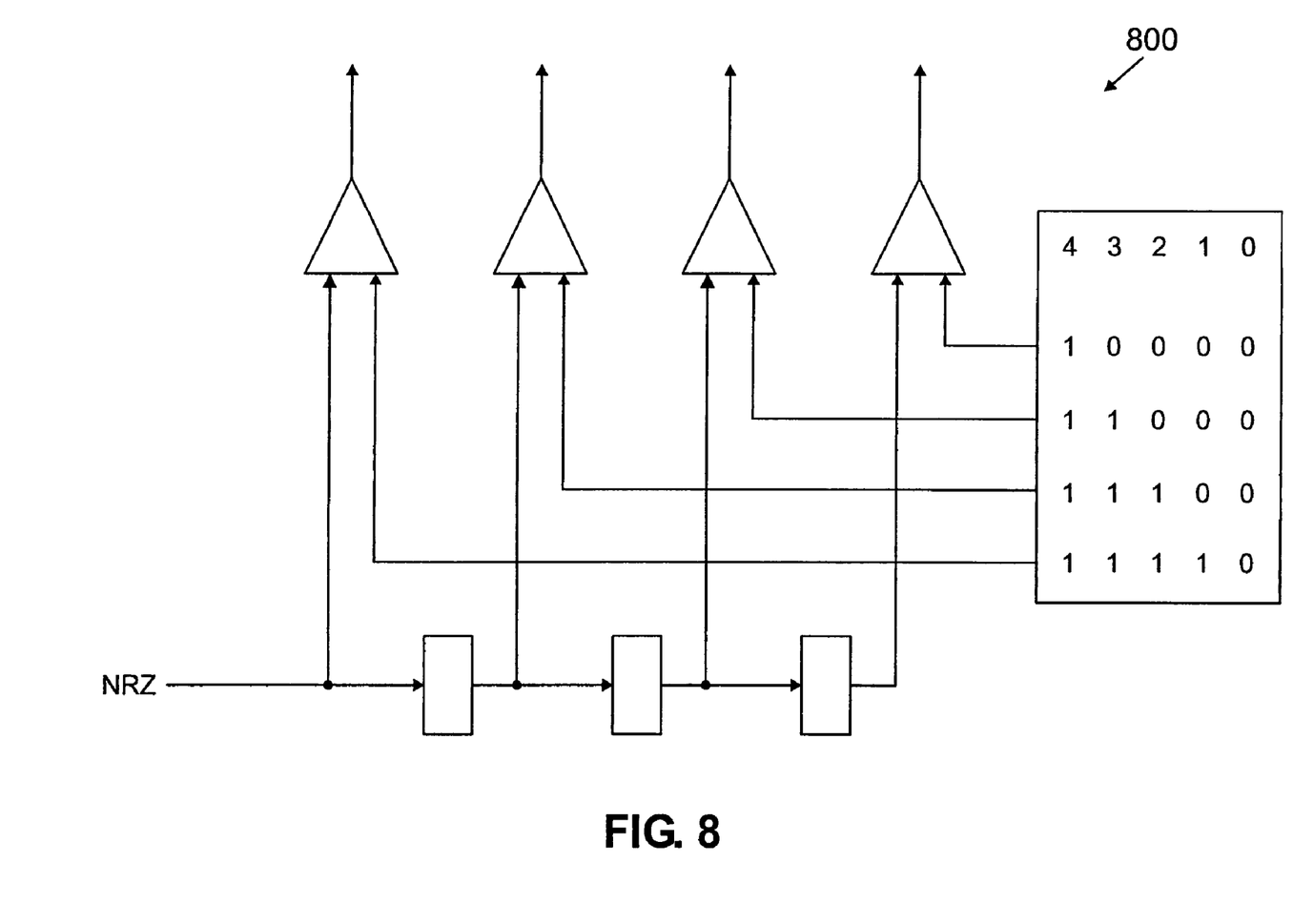
FIG. 8 is a control circuit for a programmable number of data dependencies.

It is noted that the control lines that control the multiplexers and demultiplexers in FIGS. 3, 5 and 6 comprise a bus of four consecutive delays of the binary NRZ estimate. FIG. 8 is a control circuit 800 for a programmable number of conditions (from d=4 to d=0). FIG. 8 shows a modification to these four delays that would be situated upstream from the multiplexers and demultiplexers. A programmable number of the oldest bits are forced to zero, thus forcing a corresponding subset of the accumulation registers in the adaptation circuits to be used during adaptation.

In one exemplary application, the adaptive circuit serves to calibrate parameters used in a Viterbi detector. In another application, the adaptive circuit serves to calibrate parameters used in a post-processor acting on the initial NRZ estimate produced by a Viterbi detector.

It is to be understood that the embodiments and variations shown and described herein are merely illustrative of the principles of this invention and that various modifications may be implemented by those skilled in the art without departing from the scope and spirit of the invention. For example, the invention can be implemented in magnetic recording system, and other applications, such as Ethernet in general and a future 10 Gigabit Ethernet over copper system in particular, as well as wireless communications.

We claim:

1. A method for determining a plurality of filter tap weights used to generate one or more branch metrics, said method comprising steps of:
accumulating a plurality of sets of adaptive filter tap weights for a noise predictive filter, wherein each set of adaptive filter tap weights corresponds to a data condition, wherein at least one of said sets of adaptive filter tap weights is updated upon an occurrence of a corresponding data condition, and wherein each corresponding data condition is based on an occurrence of a predefined data pattern, wherein said predefined data pattern is defined prior to an occurrence of said accumulating step.

2. The method of claim 1, wherein said data conditions comprise each possible data pattern for a given data dependency length.

3. The method of claim 1, wherein said accumulating step further comprises the step of selecting one of said accumulated filter tap weights to update based on a data condition associated with received data.

4. The method of claim 1, wherein said plurality of filter tap weights are updated for a delay j tap as follows:

$$(w_j^{[\alpha]})_{i+1} = (w_j^{[\alpha]})_i - g n_{i-j} e_i, (1 \leq j \leq c),$$

wherein $\alpha$ is one of a plurality of data conditions, $(w_j^{[\alpha]})_i$ is a register value for the delay j tap for a cycle i corresponding to $\alpha$, $(w_j^{[\alpha]})_{i+1}$ is a register value for the delay j tap for a cycle i+1, g is a gain parameter, $n_{i-j}$ is an estimate of the noise corresponding to $\alpha$ and $e_i$ is an error term.

5. The method of claim 1, further comprising the step of providing said accumulated adaptive filter tap weights to a Viterbi detector for computation of said one or more branch metrics.

6. The method of claim 1, further comprising the step of providing said accumulated adaptive filter tap weights to a post-processor acting on an initial data estimate produced by a Viterbi detector.

7. The method of claim 1, further comprising the step of removing a bias from a noise estimate.

8. The method of claim 1, further comprising the step of normalizing said filter tap weights.

9. The method of claim 1, wherein said plurality of filter tap weights are associated with a delay 0 tap and wherein said accumulating step further comprises the step of adapting said filter tap weights for each filter condition except for a single normalizing condition, whose corresponding delay 0 tap remains fixed.

10. A method for determining a plurality of filter biases used to generate one or more branch metrics, said method comprising the steps of:
accumulating a plurality of sets of adaptive filter biases for a noise predictive filter, wherein each set of adaptive filter biases corresponds to a data condition, wherein at least one of said sets of adaptive filter biases is updated upon an occurrence of a corresponding data condition, and wherein each corresponding data condition is based on an occurrence of a predefined data pattern, wherein said predefined data pattern is defined prior to an occurrence of said accumulating step.

11. The method of claim 10, wherein said data conditions comprise each possible data pattern for a given data dependency length.

12. The method of claim 10, wherein said accumulating step further comprises the step of selecting one of said accumulated filter biases to update based on a data condition associated with received data.

13. The method of claim 10, wherein said plurality of filter biases are updated as follows:

$$o_{i+1}^{[\beta]} = o_i^{[\beta]} + g e_i,$$

wherein $\beta$ is one of a plurality of data conditions, $o_i^{[\beta]}$ is a register value for a cycle i corresponding to $\beta$, $o_{i+1}^{[\beta]}$ is a register value for a delay j tap for a cycle i+1, g is a gain parameter, and $e_i$ is an error term corresponding to $\beta$.

14. The method of claim 10, further comprising the step of providing said accumulated adaptive filter biases to a Viterbi detector for computation of said one or more branch metrics.

15. The method of claim 10, further comprising the step of providing said accumulated adaptive filter biases to a post-processor acting on an initial data estimate produced by a Viterbi detector.

16. The method of claim 10, wherein said accumulating step is performed in a filter tap weight adaptation loop.

17. The method of claim 10, further comprising the step of normalizing said filter biases.

18. An adaptive noise prediction circuit for determining filter tap weights used to generate one or more branch metrics, said adaptive noise prediction circuit comprising:
a register for accumulating a plurality of sets of adaptive filter tap weights, wherein each set of adaptive filter tap weights corresponds to a data condition, wherein at least one of said sets of adaptive filter tap weights is updated upon an occurrence of a corresponding data condition, and wherein each corresponding data condition is based on an occurrence of a predefined data pattern, wherein said predefined data pattern is defined prior to an occurrence of said accumulating step.

19. The adaptive noise prediction circuit of claim 18, wherein said data conditions comprise each possible data pattern for a given data dependency length.

20. The adaptive noise prediction circuit of claim 18, further comprising a multiplexer for selecting one of said accumulated filter tap weights to update based on a data condition associated with received data.

21. The adaptive noise prediction circuit of claim 18, further comprising a shared adder for adding a previous value of said filter tap weight to a current value of said filter tap weight for each of said data conditions.

22. The adaptive noise prediction circuit of claim 18, further comprising a register for accumulating an adaptive filter bias for each data condition.

23. The adaptive noise prediction circuit of claim 22, further comprising a shared adder for adding a previous value of said filter bias to a current value of said filter bias for each of said data conditions.

* * * * *